United States Patent [19]
Christison

[11] 4,327,398
[45] Apr. 27, 1982

[54] COOLING SYSTEM FOR AUTOMATIC BOWLING PIN SPOTTER

[75] Inventor: Alan M. Christison, Knoxville, Tenn.

[73] Assignee: Product Technologies, Inc., Knoxville, Tenn.

[21] Appl. No.: 72,149

[22] Filed: Sep. 4, 1979

[51] Int. Cl.³ .................... H01L 25/00; H01L 23/46; F28F 9/22

[52] U.S. Cl. ................... 361/384; 165/80 C; 165/122; 165/146; 273/46

[58] Field of Search .............. 361/384; 312/236; 165/80 C, 122, 146

[56] References Cited

U.S. PATENT DOCUMENTS

| | | | |
|---|---|---|---|
| 1,537,228 | 5/1925 | Gargan | 165/80 C |
| 2,897,487 | 7/1959 | Owen | 312/236 |
| 2,947,957 | 8/1960 | Spindler | 165/80 C |
| 3,364,838 | 1/1968 | Bradley | 165/80 C |
| 4,035,711 | 7/1977 | Piller | 361/384 X |
| 4,084,250 | 4/1978 | Albertine et al. | 361/384 X |
| 4,142,091 | 2/1979 | Biethan, Sr. | 361/384 X |
| 4,167,771 | 9/1979 | Simons | 165/185 X |

FOREIGN PATENT DOCUMENTS 1128887 10/1968 United Kingdom ................ 361/384

Primary Examiner—Sheldon J. Richter
Attorney, Agent, or Firm—Luedeka & Fitch

[57] ABSTRACT

A cooling system for the electrical components compartment of an automatic bowling pin spotter having a low power subcompartment and a high power subcompartment, includes an upwardly projecting chimney structure which supports a fan. The fan forces air flow from the ambient environment through the low power subcompartment and then through the high power subcompartment of the pin spotter, over a generally U-shaped path, in order to remove heated air from within the subcompartments with only one pass of the air therethrough. A plurality of openings in the hood, partitioned from the chimney structure, permits the heated air to exit into the ambient environment thereby maintaining a cool operating temperature within the compartment. Filtering screens are also provided to minimize the introduction of foreign particles into the interior of the electrical components compartment.

5 Claims, 2 Drawing Figures

COOLING SYSTEM FOR AUTOMATIC BOWLING PIN SPOTTER

This invention relates to a cooling system and more specifically to a cooling system for the electronics compartment of an automatic bowling pin spotter.

Control cabinets or compartments of automatic bowling pin spotters generally include a variety of electrical and electromechanical components. The components in such equipment are generally divisible into two groups: the high power components, which produce a substantial amount of heat and can perform satisfactorily at slightly elevated temperatures, such as transformers and relays, and the low power components which produce less heat and which are adversely affected by heat, such as transistor circuit boards. These components, all of which produce varying amounts of heat during operation, are generally housed within a substantially closed compartment for protection from particulate matter and physical damage.

A problem of overheating arises within these electronics compartments because the only means by which the heat generated by the aforesaid components is dissipated is through free radiation through the compartment walls and cover into the surrounding ambient atmosphere. This method has not proven satisfactory as is evidenced by the substantial number of heat related failures of these components.

Many owners of spotters merely remove the covers of the component compartments in an effort to reduce the elevated temperatures. However, such a practice permits the entry of a large amount of particulate matter, which is especially damaging to electromechanical components. Furthermore, the practice is also dangerous in that an object, or even an operator's hand, can enter the compartment and cause physical damage and short circuits. Nevertheless, the practice has been followed in an unsuccessful effort to overcome heat accumulation.

In order to accommodate the different heat situations within a single box, pin spotter equipment manufacturers have segregated the two groups of components from each other, dividing the main compartment into two subcompartments with partitioning walls. In addition, as an added precaution, heat sinks have been located around certain components which develop particularly large amounts of heat, in order to minimize heat transfer to more sensitive components. However, even this partitioned arrangement produces a substantial number of heat related failures in pin spotter electrical equipment. In order to reduce these failures, thereby increasing useful operating time and component life, it is desirable to provide a satisfactory means of cooling the heat-producing elements of the automatic pin setter.

Although it has long been known to force ambient air through an enclosure for cooling, merely forcing air flow directly through the electronics compartment has not been satisfactory for automatic pin setting equipment. When air is merely blown into the whole compartment, it naturally follows the path of least resistance. Thus, depending upon the arrangement of wiring, the air may keep some portions adequately cooled while other portions along the more tortuous paths are not adequately cooled. Alternatively, if the total air flow is increased to the level which reduces the overall temperature to a tolerable level, large fans are required and an unacceptably large amount of particulate matter is introduced. While one might provide extensive filtering screens and increase the fan size and power to overcome the increased air flow resistance of the screens, the expense becomes prohibitive for pin spotting equipment. Thus, direct forced air for the entire compartment has not heretofore provided a satisfactory solution to the overheating problems.

It is therefore an object of the present invention to provide inexpensive system for displacing the heated air from the control compartment of an automatic pin spotter. It is also an object to provide heat dissipation means which are adaptable to presently manufactured pin spotters. It is a further object of this invention to minimize the amount of particulate matter entering the electronic component compartment. Other objects and advantages of the present invention will be apparent from the present disclosure including the drawings in which.

Figure 1:
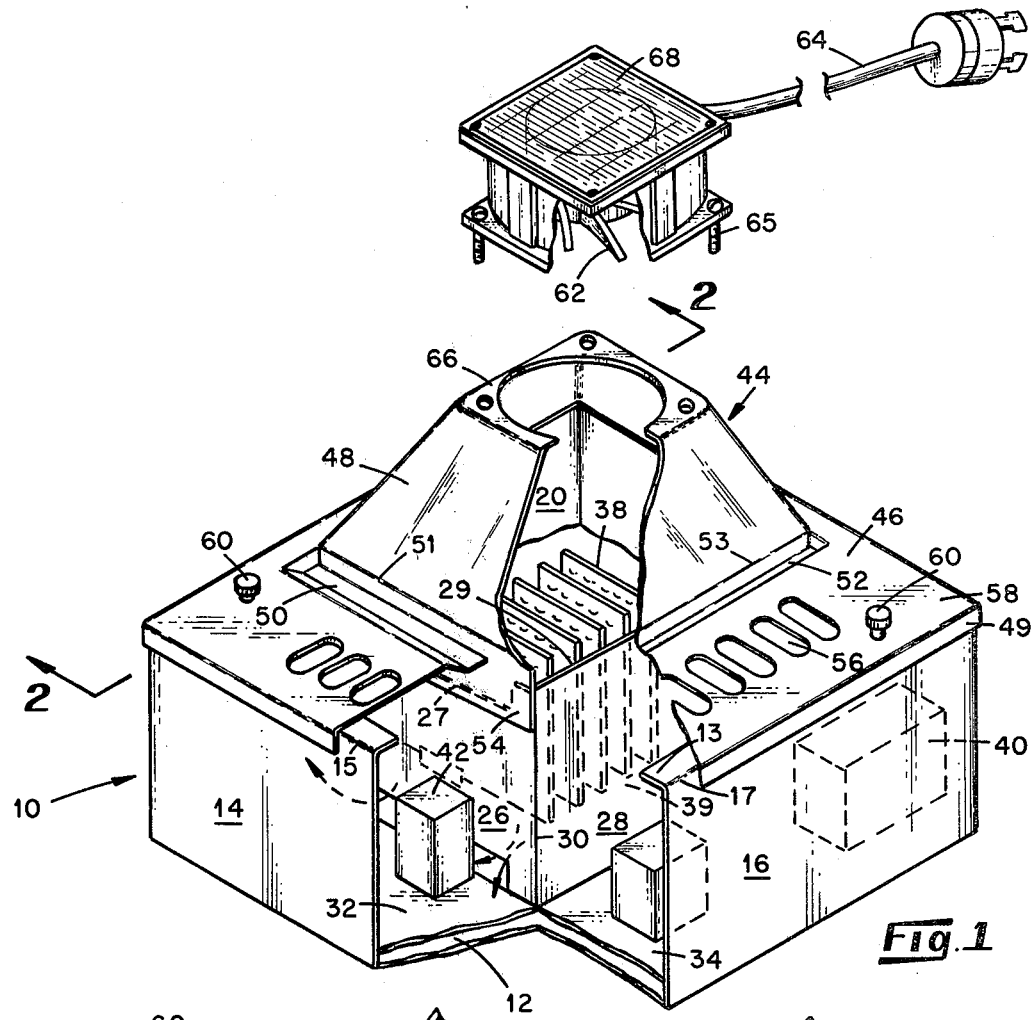
FIG. 1 is a partially exploded, cut-away perspective view illustrating a cooling system embodying various of the features of the present invention.
Figure 2:
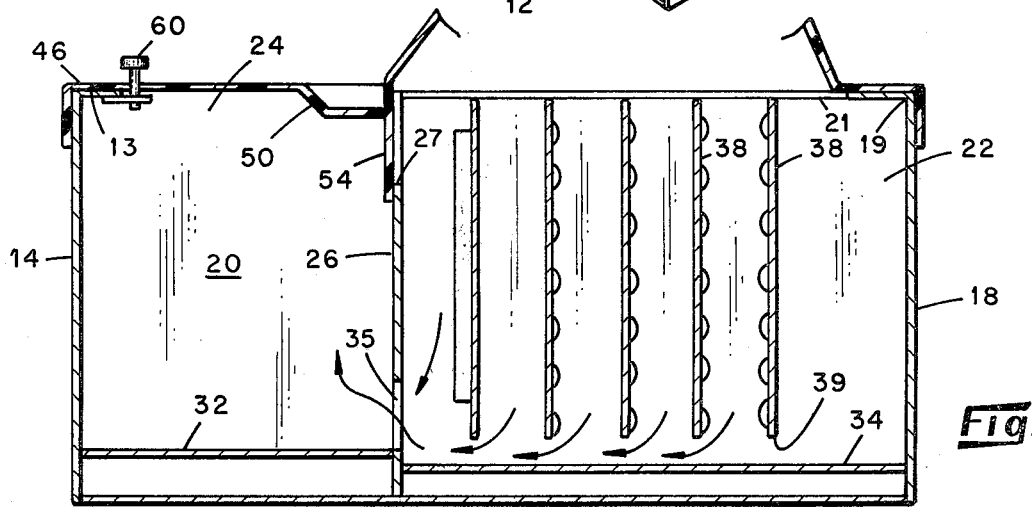
FIG. 2 is a cross-sectional view, taken along line 2—2 of FIG. 1.

In accordance with the present disclosure, the top of a standard automatic bowling pin spotter, such as an AMF Model 8270 SS, is covered by a hood means including an entrance section and an exit section. The entrance section is provided with a fan including power cord means whereby it is energized. When energized, the fan causes air to be drawn from the ambient atmosphere and funneled downwardly by the geometry of the hood means first into and through a low power subcompartment, thence upwardly through a high power subcompartment, along a generally U-shaped path. A plurality of openings are provided within the exit section of the hood such that after circulation the air exhausts outwardly therethrough. The entrance and exit sections are segregated so that the circulating air must follow the aforesaid path.

Referring more particularly to the drawings, in the depicted embodiment there is shown an automatic bowling pin spotter control cabinet 10 of a rectangular geometry, having a solid bottom wall 12, and solid side walls 14, 16, 18 and 20. An inwardly directed flange 13 is attached to the cabinet 10 along the upper edges 15, 17, 19 and 21 of the side walls 14, 16, 18 and 20, respectively. The cabinet 10 is divided into two subcompartments 22 and 24 by partition walls 26 and 28, having upper edges 27 and 29, respectively. The partition walls 26 and 28 are parallel to the side walls 14 and 16, respectively, perpendicular to one another, joined along the vertical edge 30 and connected to the side walls 20 and 18, respectively. The subcompartments 22 and 24 are further defined by floors 32 and 34, respectively, for mounting pin spotter electrical control components. At least one slot 35 is defined in the lower portion of the wall 26, above the floors 32 and 34 to permit lateral air flow from the subcompartment 22 into the subcompartment 24.

Electronic and electromechanical components for controlling a pin spotter are mounted within the cabinet 10. The electrical components are arranged within the subcompartments 22 and 24 such that the low power components, such as transistor circuit boards 38, are grouped in the low power subcompartment 22. The circuit boards 38 are mounted above the floor 34 to permit transverse air flow between the lower edges 39 of the circuit boards and the floor 34. High power components such as a power transformer 40, relays 42, and associated circuitry therefor, are located external to the subcompartment 22, and within the high power subcompartment 24.

As depicted in FIG. 1, there is provided a hood 44 comprising a generally planar rectangular base 46 with an upwardly projecting truncated pyramid, or chimney 48. The hood 44 preferably comprises a molded thermoplastic material. The base 46 has dimensions substantially identical to the rectangular outline defined by the edges 15, 17, 19 and 21. In the depicted embodiment the base is about fourteen inches by fourteen inches. A depending flange 49 extends around the entire perimeter of the base 46 to ensure that the cabinet 10 is entirely closed when the hood 44 is mounted upon the cabinet 10.

The chimney 48, which provides the air inlet section of the hood 44, extends upwardly from the plane defined by the base 46. The base of the chimney 48, which is approximately equal in both length and width to the rectangular outline defined by the edges 19, 21, 27 and 29 of the low power compartment of the cabinet, is located in one corner of the rectangular base 46 such that it is located directly above the low power subcompartment 22 when the hood 44 is mounted upon the box 10. In a preferred embodiment troughs 50 and 52 are defined in the base 46 along the lower edges 51 and 53 of the chimney 48. In the depicted embodiment, the base of the chimney 48 is approximately eight inches along the edge 51 and approximately 10 inches along the edge 53. The troughs 50 and 52 extend downwardly from the plane of the base into the subcompartment 24, adjacent to and outside of the walls 26 and 28, preferably about one-half inch, thereby preventing air flow from the chimney 48 directly into the subcompartment 24. All air flow from the chimney therefore is caused to enter the subcompartment 22 initially.

In some embodiments of the spotter control cabinet 10, the edge 27 of the partition wall 26 is cut down to a level such that the trough 50 is not of sufficient depth to block air flow from the chimney directly into the subcompartment 24. That is, air can flow between the edges 27 and the trough 50. Therefore, to further facilitate the efficient transfer of air from the chimney to only the subcompartment 22 initially, a depending apron 54 is secured to the trough 50 such that it extends into the subcompartment 24 adjacent to and outside of the partition wall 26 beyond the edge 27. This ensures that all cooling air is directed first through the subcompartment 22 which contains the most heat-sensitive components.

A plurality of elongated slots or vents 56 are defined in the L-shaped planar portion 58 of the base 46 which lies over the L-shaped subcompartment 24. This planar portion 58, with the slots defined therein, provides the exit section for the hood 44.

In order to force cooling air through the component subcompartments 22 and 24, a box fan 62, having an associated electrical power cord 64, is attached to the upper surface 66 of the chimney 48, as by bolts 65. In the depicted embodiment, the upper surface 66 is about five inches by five inches and the chimney is about three inches in height. The fan 62 is preferably capable of transferring about 110 cubic feet per minute in an unrestricted mode, so that with air flow resistance on the path through the box 10, the air flow is preferably greater than about 50 cfm. A box fan adapted for use in accordance with the present invention is available from the Dayton Electric Mfg. Co. of Chicago, Illinois, having a model number 4C550. This fan operates at about 3100 rpm. There is further provided a screening means 68 for the intake of the fan 62 to prevent the forced air from introducing foreign particles into the subcompartments 22 and 24, as well as to prevent particles from falling through the chimney 48 when the fan is not in operation.

In the depicted embodiment, attaching means comprising two quarter-turn fasteners 60 are included in the planar portion 58 of the base 46 to engage the inward flange 13, thus securing the hood 44 to the cabinet 10.

In operation, ambient air is drawn from outside the enclosed cabinet 10 and forced downwardly by the fan 62 through the chimney 48, into only the subcompartment 22 initially.

As the air enters the chimney 48 at the upper surface 66, it is pressurized and pushed at a high velocity into the chimney 48. Then, due to the expanding cross-sectional area of the truncated pyramidal chimney, the air expands causing a pressure drop, as well as a reduction in air velocity. Thus, the air from a small, inexpensive fan is distributed over the larger area of the low power subcompartment. Furthermore, the full power of the fan is used to draw in air for a high air flow, yet that power is dissipated so that any intruding particulate matter is not thrown against the sensitive equipment contained within the subcompartment 22.

Within the subcompartment 22, the air flows downwardly along both sides of the circuit boards 38, absorbing essentially all of the heat produced thereby. At the bottom of the subcompartment 22, the air flows transversely under the bottom edges 39 of the circuit boards 38 and passes into the subcompartment 24 through the slot 35. After circulation through the high-power subcompartment 24, where heat is drawn from the transformers and relays, the warmed air exits upwardly through the exit slots 56 into the ambient environment, completing a generally U-shaped path.

The flow of air transports the heat generated by the electrical and electronic components within the cabinet 10 to the ambient environment. Continuous replacement of the internal air with cooler ambient air results in an operating temperature which is up to 30 degrees cooler than is experienced without the cooling hood 44. By causing the air to circulate in the manner described above, i.e., first downwardly through the subcompartment 22, then upwardly through the subcompartment 24, the more heat-sensitive components are exposed to the coolest air first to offset their own generation of heat as well as the heat generated in and transmitted from the high power subcompartment 24. The slightly warmed air then passes over the higher power components where it absorbs the bulk of the heat produced within the cabinet 10. Thus, rather than reentering the subcompartment 22, the volume of air with the greatest heat concentration is forced immediately out of the enclosure in a naturally rising path. Preferably, the rate of air flow should be at least about 50 cubic feet per minute for an enclosure having a total volume of about one cubic foot. Greater rates of heat flow are not beneficial and possibly even detrimental to the equipment. In any event, the stated preferred flow rate of the air is economically obtained while providing the desired beneficial cooling. Notably, these results are obtained without expensive physical alteration of the existing equipment.

To install the fully assembled cooling hood 44, the hood 44 is positioned over the box 10 such that the flange 49 extends about the outside of the side walls 14, 16, 18 and 20, and the troughs 50 and 52 extend along the lengths of the walls 26 and 28, respectively. The troughs 50 and 52 also prevent incorrect mounting of the hood 44. That is, if the hood is rotated from its proper alignment, the troughs rest upon the walls 26 and 28, raising the entire hood. The chimney 48 is located directly above the subcompartment 22 and the exit slots 56 are located directly above the subcompartment 24. The hood 44 is secured by rotating the fasteners 60 approximately one-quarter turn clockwise to engage the flange 13. By then connecting the fan cord 64 to a proper power source, such as 115 volts, 60 cps., air is forced through the box in a generally U-shaped path, thereby maintaining an operating temperature that is essentially equivalent to the ambient temperature.

While a preferred embodiment of the present invention has been illustrated and described herein, it will be understood that changes and modifications may be made therein without departing from the invention in its broader aspects.

Various features of the invention are defined in the following claims.

I claim:

1. A cooling system for an automatic bowling pin spotter control cabinet including generally solid side walls and partition walls defining within said cabinet a first subcompartment having at least one low power electronic component mounted therein and having a generally solid bottom wall and a second subcompartment having at least one high power electronic component mounted therein and having a generally solid bottom wall, said subcompartments being in flow communication with one another adjacent said bottom walls, said cooling system comprising hood means including an inlet section providing cover means for said low power subcompartment and an outlet section providing cover means for said high power subcompartment, said inlet section including fan means and said outlet section including vent means whereby ambient atmospheric air is forced to flow downwardly from said inlet section through said low power subcompartment, laterally into said high power subcompartment, and upwardly through said high power subcompartment, returning to the ambient atmosphere through the vents of said outlet section.

2. A cooling system in accordance with claim 1 wherein said outlet section is generally planar and has the shape of said second subcompartment.

3. A cooling system in accordance with claim 1 wherein said inlet section comprises a chimney extending upwardly from said outlet section, said fan means being mounted upon said chimney.

4. A cooling system in accordance with claim 3 wherein said chimney comprises a truncated pyramid.

5. A cooling system in accordance with claim 1 wherein said hood further comprises segregating means between said inlet section and said outlet section for preventing air flow from said inlet section directly to said second subcompartment.

* * * * *